(12) United States Patent
Dupuy et al.

(10) Patent No.: US 8,952,615 B2
(45) Date of Patent: Feb. 10, 2015

(54) CIRCUIT ARRANGEMENT, LIGHTING APPARATUS AND METHOD OF CROSSTALK-COMPENSATED CURRENT SENSING

(75) Inventors: Philippe Dupuy, Toulouse (FR); Denis Sergeevich Shuvalov, Zelenograd (RU); Alexander Petrovich Soldatov, Zelenograd (RU); Vasily Alekseyevich Syngaevskiy, Moscow (RU); Gennady Mihailovich Vydolob, Moscow (RU)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/119,364

(22) PCT Filed: Jun. 14, 2011

(86) PCT No.: PCT/RU2011/000412
§ 371 (c)(1),
(2), (4) Date: Nov. 21, 2013

(87) PCT Pub. No.: WO2012/173507
PCT Pub. Date: Dec. 20, 2012

(65) Prior Publication Data
US 2014/0091711 A1    Apr. 3, 2014

(51) Int. Cl.
*B60Q 1/14*      (2006.01)
*H05B 37/02*   (2006.01)
(Continued)

(52) U.S. Cl.
CPC ............ *H05B 37/02* (2013.01); *G01R 19/0053* (2013.01); *G01R 19/0092* (2013.01); *H05B 33/0842* (2013.01)
USPC .................................. 315/77; 315/80; 315/81

(58) Field of Classification Search
USPC ........ 315/77, 80, 81; 313/104, 499, 501, 512, 313/534
See application file for complete search history.

(56) References Cited

U.S. PATENT DOCUMENTS

| 6,300,818 | B1 | 10/2001 | Mao |
| 6,384,519 | B1 * | 5/2002 | Beetz et al. ............ 313/103 CM |
| 6,825,626 | B2 | 11/2004 | Peterson |

(Continued)

FOREIGN PATENT DOCUMENTS

EP    1724747 A1    11/2006

OTHER PUBLICATIONS

International Search Report and Written Opinion correlating to PCT/RU2011/000412 dated Jun. 13, 2012.

*Primary Examiner* — Tung X Le

(57) ABSTRACT

A circuit arrangement comprises a plurality of current channels located in different die areas of a shared circuit die, at least one of the plurality of current channels comprising a power device; at least one sense circuit connected to one or more of the different die areas and arranged to provide a sense current from sensing a current through a primary of the plurality of current channels comprising one of the different die areas. The at least one sense circuit comprises a compensation module arranged to provide a compensation current adapted to at least partly compensate a deviation of the sense current caused by crosstalk between the primary and one or more secondary of the plurality of current channels depending on one or more secondary currents flowing through the one or more secondary current channels; wherein the compensation module is arranged to provide the compensation current at least partly as a weighted sum of the one or more secondary currents.

15 Claims, 4 Drawing Sheets

(51) Int. Cl.
  *G01R 19/00*  (2006.01)
  *H05B 33/08*  (2006.01)

(56) References Cited

U.S. PATENT DOCUMENTS

| | | | |
|---|---|---|---|
| 7,190,215 B2 | 3/2007 | Balakrishnan et al. | |
| 7,852,148 B2 | 12/2010 | Massie et al. | |
| 8,525,416 B2 * | 9/2013 | Roger et al. | 315/82 |
| 8,564,205 B2 * | 10/2013 | Roberts et al. | 315/82 |
| 2002/0047792 A1 | 4/2002 | Van Den Bom et al. | |
| 2003/0011421 A1 | 1/2003 | Enriquez | |
| 2005/0140270 A1 * | 6/2005 | Henson et al. | 313/501 |
| 2011/0260615 A1 * | 10/2011 | Roger et al. | 315/77 |
| 2011/0309746 A1 * | 12/2011 | Eckel et al. | 315/77 |

* cited by examiner

| 1/K1 | 1/K2 | | 1/K3 | |
|---|---|---|---|---|
| 865801 | 50000000 | OUT3 | 1255230 | |
| OUT1 | OUT2 | OUT3 | OUT5 | |
| OFF | OFF | ON | OFF | |
| ON | OFF | ON | OFF | |
| OFF | ON | ON | OFF | |
| ON | ON | ON | OFF | |
| OFF | OFF | ON | ON | |
| ON | OFF | ON | ON | |
| OFF | ON | ON | ON | |
| ON | ON | ON | ON | |

| Iout3(mA) | Isense(uA) | Ratio | deviation [%] | I_comp(uA) | deviation [%] |
|---|---|---|---|---|---|
| 98.6 | 19.2 | 5135 | 0.00% | 0.00 | 0.00 |
| 98.6 | 21.51 | 4584 | -10.74% | -2.31 | 0.00% |
| 98.6 | 19.24 | 5125 | -0.21% | -0.04 | 0.00% |
| 98.6 | 21.81 | 4521 | -11.97% | -2.35 | 1.35% |
| 98.6 | 21.59 | 4567 | -11.07% | -2.39 | 0.00% |
| 98.6 | 25.05 | 3936 | -23.35% | -4.70 | 5.99% |
| 98.6 | 22.05 | 4472 | -12.93% | -2.43 | 2.19% |
| 98.6 | 24.35 | 4049 | -21.15% | -4.74 | 2.14% |

FIG. 5

CIRCUIT ARRANGEMENT, LIGHTING APPARATUS AND METHOD OF CROSSTALK-COMPENSATED CURRENT SENSING

FIELD OF THE INVENTION

This invention relates to a circuit arrangement, a lighting apparatus and a method of crosstalk-compensated current sensing.

BACKGROUND OF THE INVENTION

A vehicle, for example a car, usually contains a vehicle body lighting system that contains, e.g., the headlights and rear lights of the vehicle. The headlights may, for example, contain high beam headlamps, e.g. for providing the driving lights, as well as light emitting diode modules, e.g., for providing daytime running lights.

For body lighting applications, smart power switches with circuit arrangements may be used that provide switching circuits for switching different current channels of the circuit arrangement, wherein the switching circuits are provided on a single power circuit die shared between the current channels. In order to save die area, the die area occupied by a certain current channel may be located close the die area of another channel, which may create a crosstalk effect in the other circuit or channel. Crosstalk may, for example, be caused by capacitive, inductive, or conductive coupling from one channel to another, and may, for example, limit the capability of the circuit arrangement to drive a high current load, such as a high beam headlamp, and a low current load, such as a light emitting diode (LED) module with the same circuit arrangement.

A circuit arrangement may be arranged to sense a load current by sensing the current through the corresponding current channel on the shared circuit die. In an environment where heavy loads as well as light loads may be switched, the circuit arrangement may contain a power switch capable of being a low on-resistance power switch for the heavy loads and may be able to provide accurate current sense at light loads, such as light emitting diodes (LED). For example, a power switch in an automobile environment may have the ability to drive high-intensity discharge (HID) xenon and halogen lamps and light-emitting diode light sources with a single circuit arrangement, thus improving lighting efficiency and reducing material costs.

As shown in FIG. 1, a prior art current channel 10, which may be connected to voltage source VBAT and ground GND terminals, may be located in a dedicated die area, as indicated by a dashed line, of a shared circuit die, and may contain a switching device 12 and associated current sense circuit and may, for example, be built using MOSFET (metal oxide semiconductor field-effect transistor)-, Trench-FET-, HEMT (high electron mobility transistor)- or IGBT (Insulated-gate bipolar transistor)-technology, just to name a few. The current channel may, for example, contain a power switch. Here, the current sense functionality may be implemented by separating the power switch of the current channel in the (main) switching device 12 and a sense device 14, and by usage of a differential or error amplifier 16 and offset voltage source 17 to form an accurate current sense with an accuracy of the current sense function limited at low load currents, i.e. low currents through switching device 12, by crosstalk encountered when one or more neighbouring current channels (not shown) drive high currents, e.g., having a current strength of more than one Ampere (A). The ratio (Ratio) between IoutX, i.e., the current provided to a load connectable to the OUTX terminal, and the sense current Isense may be given as the resistance $R_{DS(on)}$ between drain and source of the switching device 12 and $R_{DS(on)}$ of the sense device 14 when switched on. A current sense feedback in the shown circuit is formed by the error amplifier 16 and transistor 18. The current sense feedback (negative feedback) may keep voltage potentials at the source terminals of the switching device 12 and sense device 14 equal. This may keep the current through the drain-source path of the sense transistor 14 and of transistor 18 proportional to the load current IoutX provided to output terminal OUTx. As shown, this current may be replicated by replica metal oxide semiconductor field-effect transistors (MOSFET) 20, 22, 24 and may be provided to sense output terminal CSNS with a current gain, which may be Y/X in the shown example.

In order to illustrate the reduction of the sense current accuracy in the current channel shown in FIG. 1 due to the presence of crosstalk effects caused by neighbouring current channels (not shown), an example of a table of channel switching states and corresponding sense current deviation in a third of 5 channels (with a fourth channel permanently switched off) for the prior art sense circuit shown in FIG. 1 is shown in FIG. 2, wherein channels 1 and 2 drive currents of 2A and channel 5 drives a current of 3A, if switched on, whereas the sensed channel 3 provides a low current of 98.6 mA. As can be seen, the sensed current Isense varies, depending on the crosstalk effect caused by the currents flowing through the other channels 1, 2 and 5 sharing the same die or substrate. In the shown example, a relative deviation of the actually sensed current from the correct, undisturbed sense current, where all other channels except the sensed channel 3 are switched off, may be up to 34.89%.

In U.S. Pat. No. 7,852,148, a compensation circuit is shown that is used to improve the accuracy of a current sensing signal for a single channel power FET, using distributed resistances.

In U.S. Pat. No. 6,300,818, a temperature compensation circuit for compensating a temperature dependence of a sensed current of a single channel power switch is shown.

In U.S. Pat. No. 7,190,215, a current sensing, voltage sensing and voltage drop compensation in a single channel device is described.

In U.S. Pat. No. 6,825,626, a current sensing apparatus is described that includes a memory for storing a current sense compensation value based on a difference between the resistance of a sense resistor and an ideal resistance.

SUMMARY OF THE INVENTION

The present invention provides a circuit arrangement, a lighting apparatus and a method of crosstalk-compensated current sensing as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

FIG. 5 schematically shows an example of a table of channel switching states and corresponding sense current deviation for an embodiment of a circuit arrangement having the sense circuit shown in FIG. 4.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary, as illustrated, for the understanding and appreciation of the underlying concepts of the present invention and in order not to obfuscate or distract from the teachings of the present invention.

Figure 3:
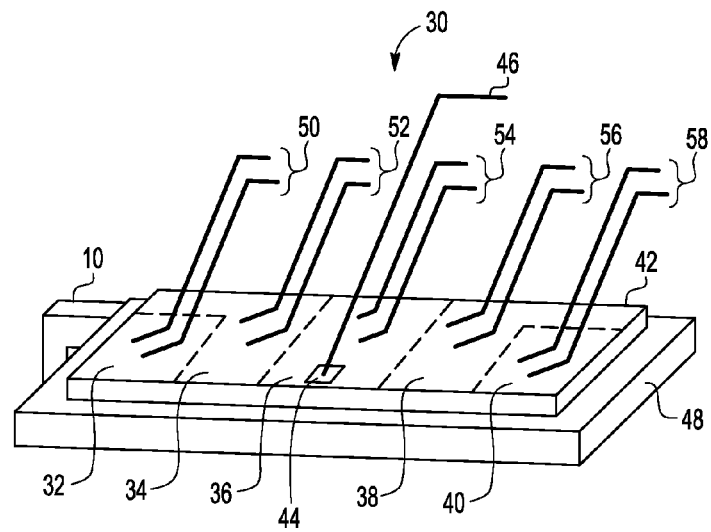
FIG. 3 schematically shows an example of an embodiment of a circuit arrangement with multiple current channels on a shared circuit die.

Referring to FIG. 3, an example of an embodiment of a circuit arrangement 30 is schematically shown, having multiple current channels 32, 34, 36, 38, 40 on a shared circuit die 42. The circuit arrangement 30 comprises a plurality of current channels 32, 34, 36, 38, 40 located in different die areas of a shared circuit die 42, at least one of the plurality of current channels comprising a power device. At least one sense circuit is connected to one or more of the different die areas and arranged to provide a sense current from sensing a current through a primary 36 of the plurality of current channels comprising one of the different die areas. The at least one sense circuit comprises a compensation module arranged to provide a compensation current adapted to at least partly compensate a deviation of the sense current caused by crosstalk between the primary 36 and one or more secondary 32, 34, 38, 40 of the plurality of current channels depending on one or more secondary currents flowing through the one or more secondary current channels; wherein the compensation module is arranged to provide the compensation current at least partly as a weighted sum of the one or more secondary currents.

In FIG. 3, a part of a sense circuit associated with the primary current channel 36 is shown. A sense area, which may comprise a sense device 44, is provided as a part of the die area of the primary current channel 36. The sense device 44 may be connected to the rest of the sense circuit through a sense source wire 46. It should be noted that the term "primary" is used only to distinguish between the current channel, where a current is to be measured and the "secondary" current channels 32, 34, 38, 40, which may be regarded as "aggressor" channels when driving a current, due to unwanted crosstalk caused in the primary channel 36.

The shared circuit die 42 may, for example, be a power die located on a lead frame 48, and each current channel 32, 34, 36, 38, 40, which may comprise a power device, may be connected to power via power source wires 50, 52, 54, 56, 58, whereas the drain terminal 60 of the circuit arrangement 30 may, for example, be shared.

A power device may, for example, be a transistor device, e.g., a power transistor. It may, for example, be a field-effect transistor (FET), such as a MOSFET or Trench-FET, a high electron mobility transistor (HEMT) or any bipolar transistor, e.g., an insulated-gate bipolar transistor (IGBT), just to name a few.

As shown, one of the channels may be connected to a sense circuit. In another embodiment, more than one, for example all, current channels may be connected to an associated sense circuit, or the current channels may be connected to a common sense circuit arranged to output sense current values for all connected channels.

Figure 4:
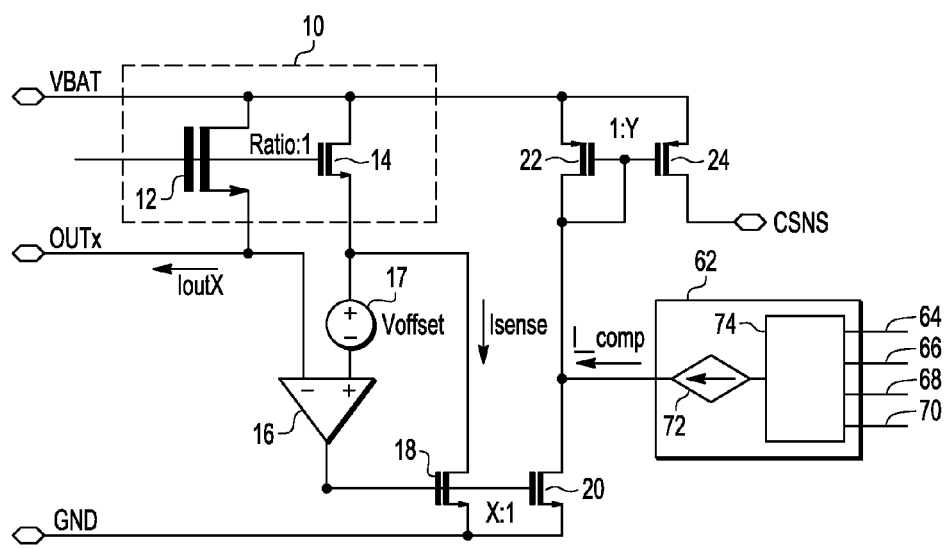
FIG. 4 schematically shows an example of an embodiment of a current channel, with a sense circuit, of a circuit arrangement.

It is shown in connection with FIG. 4, that current sense inaccuracies caused by crosstalk in the primary channel 36 due to high currents flowing through one or more of the secondary channels 32, 34, 38, 40 may be at least partly eliminated by compensating the crosstalk within the sense circuit instead of trying to eliminate the crosstalk at its origin. This may allow to keep the power die unchanged, die-size optimized and cheap, but with crosstalk effects.

Figures 1, 2:
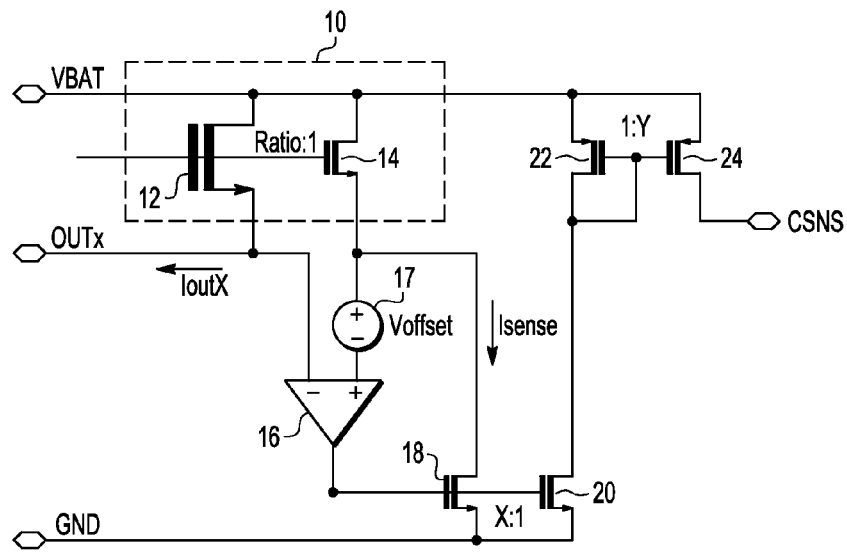
FIG. 1 schematically shows an example of a prior art power device with current sense circuit.
FIG. 2 shows an example of a table of channel switching states and corresponding sense current deviation for the prior art sense circuit shown in FIG. 1.

Referring also to FIG. 4, an example of an embodiment of a current channel with a sense circuit of a circuit arrangement is schematically shown. Only components different from the components shown in FIG. 1 will be explained in detail. The current channel may comprise a power device 12.

The shown example sense circuit may comprise a compensation module 62 arranged to provide a compensation current I_comp adapted to at least partly compensate a deviation of the sense current Isense caused by crosstalk between the shown primary 36, 10 and the secondary current channels depending on the secondary currents flowing through the secondary current channels located nearby the shown primary current channel.

The compensation module 62 may provide the compensation current I_comp at least partly as a weighted sum of the one or more secondary currents. The secondary currents may be received, for example, through terminals 64, 66, 68, 70 connected to the corresponding secondary channels (not shown) or associated sense circuits, or may, for example, receive a secondary current information from a controller unit (not shown) connected to some or all current channels of the circuit arrangement.

The compensation current may be generated in any suitable manner. For example, a linear compensation implementation may use dedicated current mirrors that scale the currents of the secondary or aggressor channels received through terminals 64, 66, 68, 70 and subtract them from the current on the CSNS terminal. Or the compensation module 62 may, for example, use a compensation current source 72 controlled by a compensation calculation circuit 74 arranged to receive the secondary current information.

The weighted sum may comprise one or more weighting coefficients for the one or more secondary currents and the one or more weighting coefficients may be determined by physical parameters of the shared circuit die.

The compensation current I_comp may, for example, be calculated by a linear approximation as $I\_comp(OUT3) = -(K1 \cdot Iout1 + K2 \cdot Iout2 + K5 \cdot Iout5)$, where, for the shown example, Iout4 may be 0 due to the fourth current channel being switched off, wherein the weighting coefficients K1, K2 and K5 may be predetermined by the given specific power die layout, i.e., may depend on physical parameters, for example, geometrical parameters, of the shared circuit die, such as for example proportions or distance between certain die areas of the different channels, but may also, for example, depend on used technologies, materials or doping, just to name a few.

Referring to FIG. 5, an example of a table of channel switching or activation states and corresponding sense current deviation for an embodiment of a circuit arrangement having the sense circuit shown in FIG. 4 is schematically shown. It can be seen that for 2A currents in channels 1 and 2 and 3A in channel 5 and with coefficients K1, K2, and K5 extracted for a specific power die layout the accuracy of the output sense current Isense+I_comp provided at sense output terminal CSNS may be improved. With 1/K1, 1/K2 and 1/K5 found to be 865801, 50000000 and 1255230, respectively, for a specifically tested die layout given as a non-limiting example, the deviation from the correct sense current without any crosstalk interference may be reduced, for example, from a maximum of 23.4% to not more than 5.99%.

Referring again to FIG. 4, the compensation module 62 may be arranged to provide the compensation current I_comp additionally determined by one or more additional parameters. The relevance of any other physical parameter may depend on the field of application of the circuit arrangement. For example, the one or more additional parameters may comprise a supply voltage of the circuit arrangement. Or the one or more additional parameters may comprise a temperature of the shared circuit die. This may include a dependency on an ambient temperature of the circuit arrangement. For example, a smart power switch having a circuit arrangement as described may exhibit a dependency on the ambient temperature, which may be relevant, for example, for application in an automotive environment.

The deviation caused by crosstalk may be predictable for a given technology and layout. For a given ideal sense current, the perturbation or deviation may be a function of the currents flowing in the other channels Iout1, Iout2, Iout4, Iout5 and in the primary channel Iout3, as well as temperature Temp and supply voltage Vbat: I_comp(Iout3)=F(Iout1, Iout2, Iout3, Iout4, Iout5, Temp, Vbat)

I_comp may be linearly approximated. More complicated equations or tabular compensation may allow further improvement of the compensation result. For example, the weighted sum may comprise at least one factor non-linearly depending on one or more of the currents. This may include that at least one factor may comprise a product of at least two different currents.

Crosstalk that may degrade the sensed current signal may, for example, be encountered in a circuit arrangement, wherein the power device 12 is a device connectable to drive a high current, for example a current of more than 1A. The effect may increase with the strength of current. One or more of the current channels, such as the secondary current channels, may have a low resistance when in conducting state and may allow a high current flow. For example, the at least one power device may have a low $R_{DS(on)}$, and may allow driving a high current. A high current may be any current having a strength higher than the sensed current strength in the primary current channel. A higher current, for example, 1A or more, e.g., 5A, may cause a higher deviation due to crosstalk than a low current, for example, below 1A or 0.1A. The circuit arrangement 30 may be used to drive high currents, for example switch high currents when the power device 12 is a high-side switch, arranged to switch on and off a supply voltage Vbat of a load circuit.

The at least one sense circuit may be arranged to sense low currents. It may, for example, be arranged to provide an open load diagnostic for the primary current channel 36, i.e., the sense circuit may be arranged to provide a crosstalk-compensated sense current Isense+I_comp for a low current Iout3 while, for example, no load is connected to current channel 3 or the load is switched off, in an environment, where neighbouring channels located on the same shared circuit die may drive high currents of, for example, several Amperes. Referring to the non-limiting example illustrated in FIG. 5, less than 100 mA may be sensed even though currents of 2A or 3A may be encountered in neighbouring channels, which may create crosstalk with the sensed primary current channel.

The shared circuit die may be comprised in a surface mountable power package, such as a power quad-flat no leads (PQFN) package, just to give an example. Due to the crosstalk-compensation, no separate dies in separate packages, for reducing any crosstalk effects, may be used for providing the different current channels.

Figure 6:
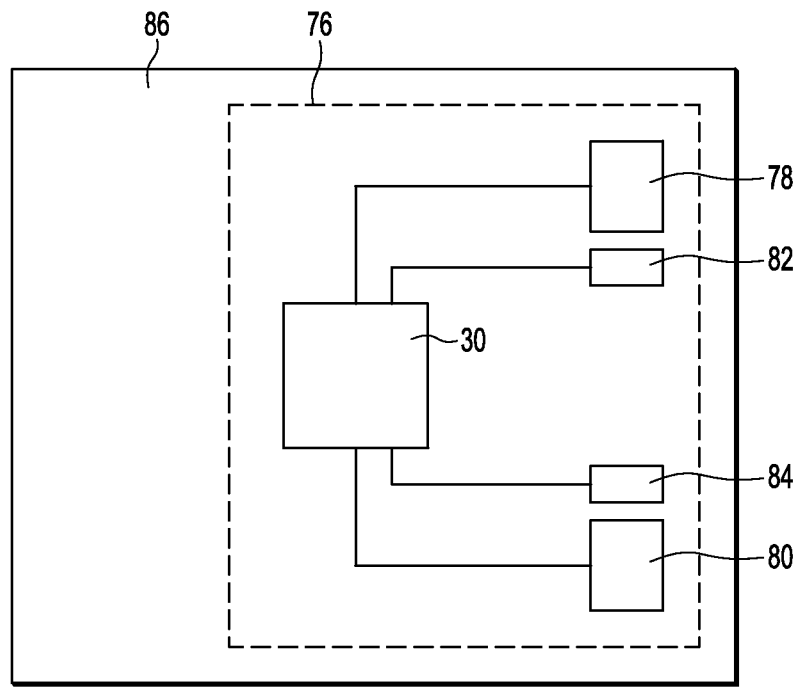
FIG. 6 schematically shows an example of an embodiment of a lighting apparatus.

Referring now to FIG. 6, an example of an embodiment of a lighting apparatus is schematically shown. The shown lighting apparatus 76 may comprise at least one high current load 78, 80, at least one low current load 82, 84 and a circuit arrangement 30 as described above, connectable to drive the at least one high current load 78, 80 and the at least one low current load 82, 84. A lighting apparatus 76 comprising different loads, e.g., different lamps may be comprised, for example, in buildings, or vehicles, such as cars, motor bikes, trains, planes or helicopters, just to name a few. In a vehicle body lighting application, the at least one high current load 78, 80 may, for example, be a high beam headlamp of a vehicle 86, whereas a low current load 82, 84 may, for example, be an LED module or a set of LEDs of the vehicle 86.

Figure 7:
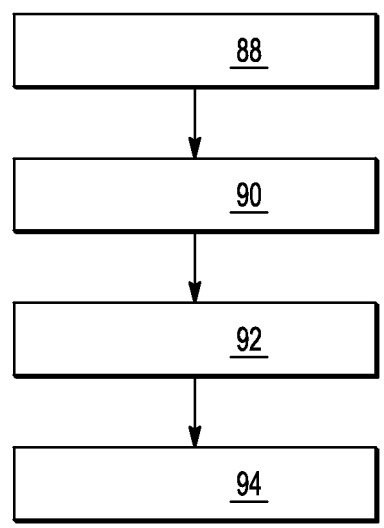
FIG. 7 schematically shows a diagram of an example of an embodiment of a method of crosstalk-compensated current sensing.

Referring now to FIG. 7, a diagram of an example of an embodiment of a method of crosstalk-compensated current sensing is schematically shown. The illustrated method allows implementing the advantages and characteristics of the described circuit arrangement as part of a method of crosstalk-compensated current sensing.

The shown method may be a method of crosstalk-compensated current sensing in a current channel of a plurality of current channels located in different die areas of a shared circuit die, at least one of the plurality of current channels comprising a power device and at least one sense circuit being connected to one or more of the different die areas. The method may comprise providing 90 a sense current from sensing a current through a primary of the plurality of current channels comprising one of the different die areas. And the method may comprise providing 92 a compensation current adapted to at least partly compensate a deviation of the sense current caused by crosstalk between the primary and one or more secondary of the plurality of current channels depending on one or more secondary currents flowing through the one or more secondary current channels; wherein the compensation current is provided at least partly as a weighted sum of the one or more secondary currents; and generating 94 a crosstalk-compensated sense current from the sense current and the compensation current.

The weighted sum may comprise one or more weighting coefficients for the one or more secondary currents and the one or more weighting coefficients may be determined by physical parameters of the shared circuit die. The method may comprise determining 88 the one or more weighting coefficients by activating and deactivating different secondary channels, measuring the sense current with a crosstalk-dependent deviation and deriving an analytic crosstalk law. Activating a current channel may refer to enabling a current flow through the current channel.

After developing the power die layout, the circuit arrangement may, for example, be modelled using a suitable device modelling tool, for extracting the crosstalk law, which may include determining the weighting coefficients. Once an analytic crosstalk law or a matrix representing the law may be available, the crosstalk law may be implemented in the compensation module.

In the foregoing specification, the invention has been described with reference to specific examples of embodiments of the invention. It will, however, be evident that various modifications and changes may be made therein without departing from the broader spirit and scope of the invention as set forth in the appended claims.

For example, the semiconductor substrate described herein can be any semiconductor material or combinations of materials, such as gallium arsenide, silicon germanium, silicon-on-insulator (SOI), silicon, monocrystalline silicon, the like, and combinations of the above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connections that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the sense circuit may be implemented in any other suitable manner.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, the compensation module 62 may be provided on the shared circuit die 42. Alternatively, the examples may be implemented as any number of separate integrated circuits or separate devices interconnected with each other in a suitable manner. For example, the compensation module 62 may not be provided on the shared circuit die 42.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While the principles of the invention have been described above in connection with specific apparatus, it is to be clearly understood that this description is made only by way of example and not as a limitation on the scope of the invention.

The invention claimed is:

1. A circuit arrangement, comprising
   a plurality of current channels located in different die areas of a shared circuit die, at least one of said plurality of current channels comprising a power device;
   at least one sense circuit connected to one or more of said different die areas and arranged to provide a sense current from sensing a current through a primary of said plurality of current channels comprising one of said different die areas, said at least one sense circuit comprising
   a compensation module arranged to provide a compensation current adapted to at least partly compensate a deviation of said sense current caused by crosstalk between said primary and one or more secondary of said plurality of current channels depending on one or more secondary currents flowing through said one or more secondary current channels; wherein said compensation module is arranged to provide said compensation current at least partly as a weighted sum of said one or more secondary currents.

2. The circuit arrangement as claimed in claim 1, wherein said weighted sum comprises one or more weighting coefficients for said one or more secondary currents and said one or more weighting coefficients are determined by physical parameters of said shared circuit die.

3. The circuit arrangement as claimed in claim 1, wherein said compensation module is arranged to provide said compensation current additionally determined by one or more additional parameters.

4. The circuit arrangement as claimed in claim 3, wherein said one or more additional parameters comprise a supply voltage of said circuit arrangement.

5. The circuit arrangement as claimed in claim 3, wherein said one or more additional parameters comprise a temperature of said shared circuit die.

6. The circuit arrangement as claimed in claim 1, wherein said weighted sum comprises at least one factor non-linearly depending on one or more of said currents.

7. The circuit arrangement as claimed in claim 1, wherein said power device is a device connectable to drive a high current.

8. The circuit arrangement as claimed in claim 1, wherein said at least one sense circuit is arranged to provide an open load diagnostic for said primary current channel.

9. The circuit arrangement as claimed in claim 1, wherein said power device is a high-side switch.

10. The circuit arrangement as claimed in claim 1, wherein said shared circuit die is comprised in a surface mountable power package.

11. A lighting apparatus, comprising
at least one high current load,
at least one low current load and
a circuit arrangement as claimed in claim 1, connectable to drive said at least one high current load and said at least one low current load.

12. The lighting apparatus as claimed in claim 11, wherein said at least one high current load is a high beam headlamp of a vehicle.

13. The lighting apparatus as claimed in claim 11, wherein said at least one low current load is a light emitting diode module of a vehicle.

14. A method of crosstalk-compensated current sensing in a current channel of a plurality of current channels located in different die areas of a shared circuit die, at least one of said plurality of current channels comprising a power device and at least one sense circuit being connected to one or more of said different die areas; said method comprising:
providing a sense current from sensing a current through a primary of said plurality of current channels comprising one of said different die areas;
providing a compensation current adapted to at least partly compensate a deviation of said sense current caused by crosstalk between said primary and one or more secondary of said plurality of current channels depending on one or more secondary currents flowing through said one or more secondary current channels; wherein said compensation current is provided at least partly as a weighted sum of said one or more secondary currents; and
generating a crosstalk-compensated sense current from said sense current and said compensation current.

15. The method as claimed in claim 14, wherein said weighted sum comprises one or more weighting coefficients for said one or more secondary currents and said one or more weighting coefficients are determined by physical parameters of said shared circuit die; the method comprising determining said one or more weighting coefficients by activating and deactivating different secondary channels, measuring said sense current with a crosstalk-dependent deviation and deriving an analytic crosstalk law.

* * * * *